(12) United States Patent
Butler et al.

(10) Patent No.: US 7,738,152 B2
(45) Date of Patent: Jun. 15, 2010

(54) HIGH AREAL DENSITY HOLOGRAPHIC DATA STORAGE SYSTEM

(75) Inventors: Christopher J. Butler, Arlington, MA (US); David A. Waldman, Concord, MA (US)

(73) Assignee: STX Aprilis, Inc., Maynard, MA (US)

( * ) Notice: Subject to any disclaimer, the term of this patent is extended or adjusted under 35 U.S.C. 154(b) by 308 days.

(21) Appl. No.: 11/295,732

(22) Filed: Dec. 6, 2005

(65) Prior Publication Data

US 2006/0152783 A1   Jul. 13, 2006

Related U.S. Application Data

(63) Continuation of application No. PCT/US2004/018116, filed on Jun. 7, 2004.

(60) Provisional application No. 60/476,812, filed on Jun. 7, 2003.

(51) Int. Cl.
  *G03H 1/00* (2006.01)
  *G03H 1/22* (2006.01)
  *G03H 1/16* (2006.01)

(52) U.S. Cl. .............................. 359/30; 359/32; 359/29

(58) Field of Classification Search .................... 359/29
  See application file for complete search history.

(56) References Cited

U.S. PATENT DOCUMENTS

| | | | | |
|---|---|---|---|---|
| 3,697,149 A | * | 10/1972 | Van Heeckeren et al. | ... 369/103 |
| 4,607,344 A | * | 8/1986 | Athale et al. | ................ 708/835 |
| 5,274,385 A | * | 12/1993 | Riza | ............................ 342/375 |
| 5,793,504 A | * | 8/1998 | Stoll | ........................... 359/11 |
| 6,088,321 A | | 7/2000 | Yamaji et al. | |
| 6,097,513 A | | 8/2000 | Noh | |
| 6,147,782 A | | 11/2000 | Daiber et al. | |
| 6,272,095 B1 | | 8/2001 | Liu et al. | |
| 6,322,931 B1 | | 11/2001 | Cumpston et al. | |
| 6,975,786 B1 | * | 12/2005 | Warr et al. | ..................... 385/17 |

(Continued)

FOREIGN PATENT DOCUMENTS

EP  0 476 536 A2  3/1992

(Continued)

OTHER PUBLICATIONS

Chou et al. 'Interleaving and error correction in volume holographic memory systems,' Oct. 1998, Applied Optics, vol. 37, No. 29, pp. 6951-6968.*

(Continued)

*Primary Examiner*—Stephone B Allen
*Assistant Examiner*—Jade R Callaway
(74) *Attorney, Agent, or Firm*—Hamilton, Brook, Smith & Reynolds, PC

(57) ABSTRACT

An apparatus for recording or reading high areal density holographically stored information with high signal-to-noise ratio. The apparatus comprises a holographic imaging system for recording or reconstructing a holographic image, having a first numerical aperture and a first focal length and an additional optical system for filtering the signal beam, having a second numerical aperture and a second focal length, wherein the numerical aperture of the additional optical system is less than the numerical aperture of the holographic imaging system and/or the focal length of the additional optical system is greater than the optical length of the holographic imaging system.

69 Claims, 7 Drawing Sheets

U.S. PATENT DOCUMENTS

| | | | |
|---|---|---|---|
| 7,116,626 B1 * | 10/2006 | Woods et al. | 369/103 |
| 2002/0122254 A1 | 9/2002 | Gluckstad | |
| 2004/0179251 A1 | 9/2004 | Anderson et al. | |
| 2005/0270609 A1 | 12/2005 | Chuang et al. | |

FOREIGN PATENT DOCUMENTS

| | | |
|---|---|---|
| EP | 0476536 A | 3/1992 |
| EP | 0 741 343 A1 | 11/1996 |
| JP | 05-100615 | 4/1993 |
| JP | 07-036356 | 2/1995 |
| JP | 08-339157 | 12/1996 |
| JP | 2000-242156 | 9/2000 |
| WO | WO 2004/102541 A | 11/2004 |
| WO | WO 2004/102541 A1 | 11/2004 |

OTHER PUBLICATIONS

Pu A. and Psaltis, D., "High-Density Recording in Photopolymer-Based Holographic Three-Dimensional Disks," *Applied Optics 35* (14):2389-2398 (1996).

Steckman, G., et al., "Storage Density of Shift-Multiplexed Holographic Memory," *Applied Optics 40* (20):3387-3394 (2001).

Szarvas, G., et al., "Multilayer Thin-Film Holographic Storage—a New Approach," International Symposium on Optical Memory and Optical Data Storage Topical Meeting, pp. 240-242 (2002).

Szarvas, G., et al., "Multilayer Thin-Film Holographic Storage—A New Approach," 2002 International Symposium on Optical Memory and Optical Data Storage Topical Meeting, Waikoloa, HI, pp. 240-242 (Jul. 2002).

Pu, Allen, et al., "High-Density Recording in Photopolymer-Based Holographic Three-Dimensional Disks," *Applied Optics*, Optical Soc. of America, Washington, DC, 35:pp. 2389-2398 (May 10, 1996).

* cited by examiner

HIGH AREAL DENSITY HOLOGRAPHIC DATA STORAGE SYSTEM

RELATED APPLICATIONS

This application is a continuation of International Application No. PCT/US2004/018116, which designated the United States and was filed on Jun. 7, 2004, published in English, which claims the benefit of U.S. Provisional Application No. 60/476,812, filed on Jun. 7, 2003. The entire teachings of the above applications are incorporated herein by reference.

BACKGROUND OF THE INVENTION

The need for cost-effective, high performance data storage has, for many applications, outpaced technology development. Enterprise storage, image archives, and entertainment content, among other applications, are driving the demand for enhanced data storage solutions. Several of these applications currently rely on storage technologies, such as optical, magneto-optical, and magnetic tape, that use removable media. These technologies, for the most part, have relatively limited improvements remaining on their roadmaps for attaining increased data density, or have limitations in achievable data rates, or in random access. Holographic data storage (HDS), on the other hand, promises both near-term performance comparable to the most optimistic long-term projections for these technologies, and a technology roadmap with many years of rapidly increasing data storage density and data transfer rate in combination with random access.

A practical embodiment of an HDS system uses relatively thin recording material, such as photopolymers, in combination with, for example, a 4f optical imaging system. Mutually coherent signal and reference beams form an interference pattern in the volume of their overlap. A hologram is recorded when light-induced changes in the storage medium, such as photopolymerization, produce a record of the resulting interference pattern. Reconstruction of the recorded hologram is accomplished by firstly illuminating the hologram with a reference beam and secondly imaging the diffracted light onto the detector array.

Recording many independent holograms in the same volume of material enhances data density. This process, called multiplexing, requires that each multiplexed hologram be recorded with a unique reference beam. Many multiplexing procedures have been described in the literature (see for example G. Barbastathis and D. Psaltis, "Volume Holographic Multiplexing Methods", Holographic Data Storage, H. J. Coufal, D. Psaltis, and G. T. Sincerbox (Eds.), Springer-Verlag, 2000). A particularly useful multiplexing procedure for relatively thin recording material uses a collimated reference beam, and combines angular and peristrophic (azimuthal) multiplexing techniques [see D. A. Waldman, H.-Y. S. Li, and E. A. Cetin, "Holographic Recording Properties in Thick Films of ULSH-500 Photopolymer", Proceedings of SPIE, Vol. 3291, pp. 89-103 (1998) and A. Pu and D. Psaltis, "High-density recording in photopolymer-based holographic three-dimensional disks", Appl. Optics, Vol. 35, No. 14, pp 2389-2398 (1996).

HDS systems that operate to maximize the data density, for a recording material of a particular thickness, use the highest numerical aperture (NA) lenses for the Fourier transform lens pair that said 4f optical imaging system can accommodate. Unfortunately, the use of high NA (NA $\geq 0.2$ for HDS systems) lenses, such as in the conventional 4f optical system wherein the first and second Fourier transform lens are a matched pair and thus have identical values of NA, can introduce several factors that contribute to the substantial decreases of signal-to-noise (SNR) in the HDS system. Most significantly, when high NA optics is used for the second Fourier transform lens, then substantially more scattered light is imaged to the detector plane than for lower NA optics. Light scattered from media or media substrates, along with light scattered from optical and mechanical surfaces is captured more efficiently by high NA optics due to the shorter working distance of said lenses and the larger acceptance field of the lens. The scattered light is imaged onto the pixilated detector and recognized as noise during hologram read-out. This phenomenon is especially evident in thin photopolymer-based media systems where a non-90 degree interbeam angle must be used for the recording geometry. The suppression of noise from various sources is critical to the maximization of storage densities, in particular the suppression of optical noise. A typical HDS system has several potential sources of optical noise including the aforementioned light scattered from the media and/or optical components, reflections from surfaces internal to the drive, and, additionally, image misalignment and distortion. In general, each of these potential noise sources become increasingly more evident and problematic in systems that endeavor to maximize areal density of stored data.

There is a need, therefore, for an apparatus and a method that improves areal data density while at the same time reducing optical noise at the detector plane that is due to scattered and stray light so as to achieve good SNR at high areal density.

SUMMARY OF THE INVENTION

In one embodiment, the present invention is an apparatus for recording or reading holographically stored information, comprising a holographic imaging system for recording or reconstructing a holographic image, having a first numerical aperture and a first focal length, and an additional optical system for filtering the holographic image, having a second numerical aperture and a second focal length, wherein the numerical aperture of the additional optical system is less than the numerical aperture of the holographic imaging system.

In another embodiment, the present invention is an apparatus for reading or writing holographically stored information, comprising an holographic imaging system, having a first focal length, for recording or reconstructing a holographic image, and an additional optical system, having a second focal length, for filtering the holographic image, wherein the first focal length is less than the second focal length.

In another embodiment, the present invention is a method of reading a holographically recorded image, comprising directing a reference beam into a holographic imaging system that includes a holographic recording media, the holographic imaging system having a first numerical aperture and a first focal length, thereby reconstructing a signal beam; directing or relaying the reconstructed signal beam through an additional optical system, having a second numerical aperture and a second focal length, wherein the second numerical aperture is smaller than the first numerical aperture, thereby filtering the reconstructed signal beam; and detecting the filtered reconstructed signal beam.

In another embodiment, the present invention is a method of reading a holographically recorded image, comprising directing a reference beam into a holographic imaging system that includes a holographic recording media, the holographic imaging system having a first focal length, thereby reconstructing a signal beam; directing the reconstructed signal beam through an additional optical system, having a second focal length, said additional optical system configured so that the second focal length is greater than the first focal length, thereby filtering the reconstructed signal beam; and detecting the filtered reconstructed signal beam.

In another embodiment, the present invention is a method of recording a holographic image, comprising directing a signal beam through a holographic imaging system that includes (i) an imaging lens element and a holographic recording media, spaced apart, and (ii) an apertured filter, disposed between the lens element and the holographic recording media, thereby producing a filtered signal beam; and directing the filtered signal beam and a reference beam at the holographic recording media, thereby recording a pattern of interference between the filtered signal beam and the reference beam.

In another embodiment, the present invention is an apparatus for reading a holographically recorded image comprising (i) means for directing a reference beam into a holographic imaging system that includes a holographic recording media, said holographic imaging system having a first numerical aperture and a first focal length, thereby reconstructing a signal beam; (ii) means for directing the reconstructed signal beam through an additional optical system, having a second numerical aperture and a second focal length, wherein the second numerical aperture is smaller than the first numerical aperture, thereby filtering the reconstructed signal beam; and (iii) means for detecting the filtered reconstructed signal beam.

In another embodiment, the present invention is an apparatus for reading a holographically recorded image, comprising means for directing a reference beam into a holographic imaging system and reconstructing a signal beam, the holographic imaging system including a holographic recording media, said holographic imaging system having a first focal length; means for directing the reconstructed signal beam through an additional optical system and filtering the reconstructed signal beam, said additional optical system having a second focal length and configured so that the second focal length is greater than the first focal length; and means for detecting the filtered reconstructed signal beam.

In another embodiment, the present invention is an apparatus for recording a holographic image, comprising means for directing a signal beam through a holographic imaging system for filtering the signal beam, the holographic imaging system including an imaging lens element and a holographic recording media, spaced apart, and an apertured filter disposed between the lens element and the holographic recording media; and means for directing the filtered signal beam and a reference beam at the holographic recording media for recording a pattern of interference between the filtered signal beam and the reference beam.

In another embodiment, the present invention is a method of recording a plurality of holographic images in a holographic media, comprising recording a first of a plurality of multiplexed holograms in at least one storage location on the holographic recording media with a first interbeam angle; and recording another of a plurality of multiplexed holograms in said storage location on the holographic recording media with a second interbeam angle. The second interbeam angle is larger than said first interbeam angle and wherein the multiplexed holograms at said storage location are partially or fully overlapped.

In another embodiment, the present invention is a method of reading a plurality of holographic images recorded in a holographic media. The method comprises (i) directing a reference beam at a storage location in a holographic recording media at a first incidence angle adjusted by a first adjustment angle, thereby reading a first of a plurality of multiplexed holograms in at the least one storage location; (ii) directing a reference beam at said storage location on the holographic recording media at a second incidence angle adjusted by a second adjustment angle, thereby reading at least a second of the plurality of multiplexed holograms recorded in said at least one storage location; and (iii) detecting the first and at least the second holograms. In this embodiment of the present invention, the first and the second adjustment angles are substantially equal.

The devices and methods of the present invention achieve high areal density ($\geq 24$ bits/$\mu m^2$) with acceptable SNR (e.g. SNR corresponding to a raw-bit-error-rate (BER) of not greater than about $10^{-2}$) for stored information that comprises multiplexed holograms that have diffraction efficiency of about $10^{-3}$ or less.

The invention further provides a method and apparatus for utilizing moderately high ($>0.2$) to high NA ($\leq 0.85$) components in HDS systems, so as to achieve high areal density of stored information ($\geq 24$ bits/$\mu m^2$) when the recording geometry of the reference beam and object beam comprises a non 90 degree interbeam angle, such as would be the case for photopolymerizable, or photochromic, or organic photorefractive recording media.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
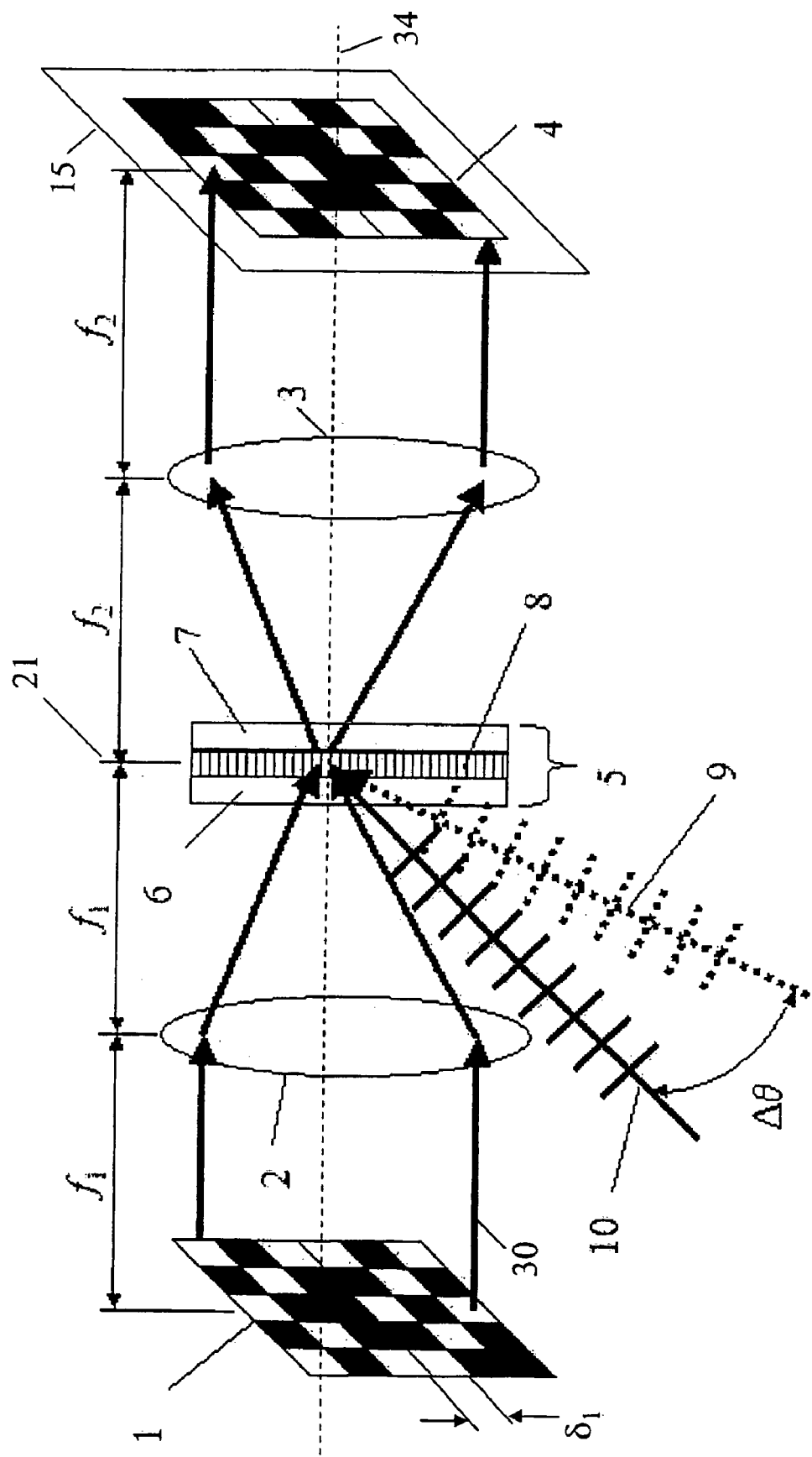
FIG. 1 is a schematic diagram of a traditional 4f optical design of a holographic recording system.

The elements of a 4f optical design are presented in FIG. 1. Signal beam 30 passes through a two dimensional array of substantially transparent or opaque pixels that are formed by the spatial light modulator (SLM) 1. Alternatively, a one dimensional array of substantially transparent or opaque pixels may be used, or the signal beam may instead reflect from a two dimensional or one dimensional array of pixels that are formed by the SLM. SLM 1 encodes signal beam 30 with data information that is to be recorded. The SLM typically modulates either the amplitude or the phase of an incident light beam, and can operate by transmission, as shown in FIG. 1, or by reflection of the incident beam to encode the data information in signal beam 30. A 4f optical arrangement of FIG. 1 comprises Fourier transform lens element (a first imaging lens element) 2, having focal distance f1, that operates to relay a Fourier transform of SLM-encoded signal beam 30 to plane 21 that is one focal distance f1 away from first imaging lens element 2. Plane 21 is two focal distances f1 away from the SLM. Second Fourier transform lens element (second imaging lens element) 3, which is generally referred to as a matched pair with element 2, is positioned at (2×f1)+f2 (i.e. 3×f1 when f1=f2) distance from SLM 1 and operates to reconstruct an image of SLM 1 at plane 15 that is one focal distance f2 away from second imaging lens element 3 and corresponds to the correlation plane at detector array 4. Plane 15 is referred to as the "image plane" or as the 4f-plane when f1=f2. As the name suggests, in a 4f optical system, plane 15 is four focal distances f1 away from SLM 1 when f1=f2. The 4f system is designed for 1:1 imaging of SLM 1 onto detector 4.

Figure 2:
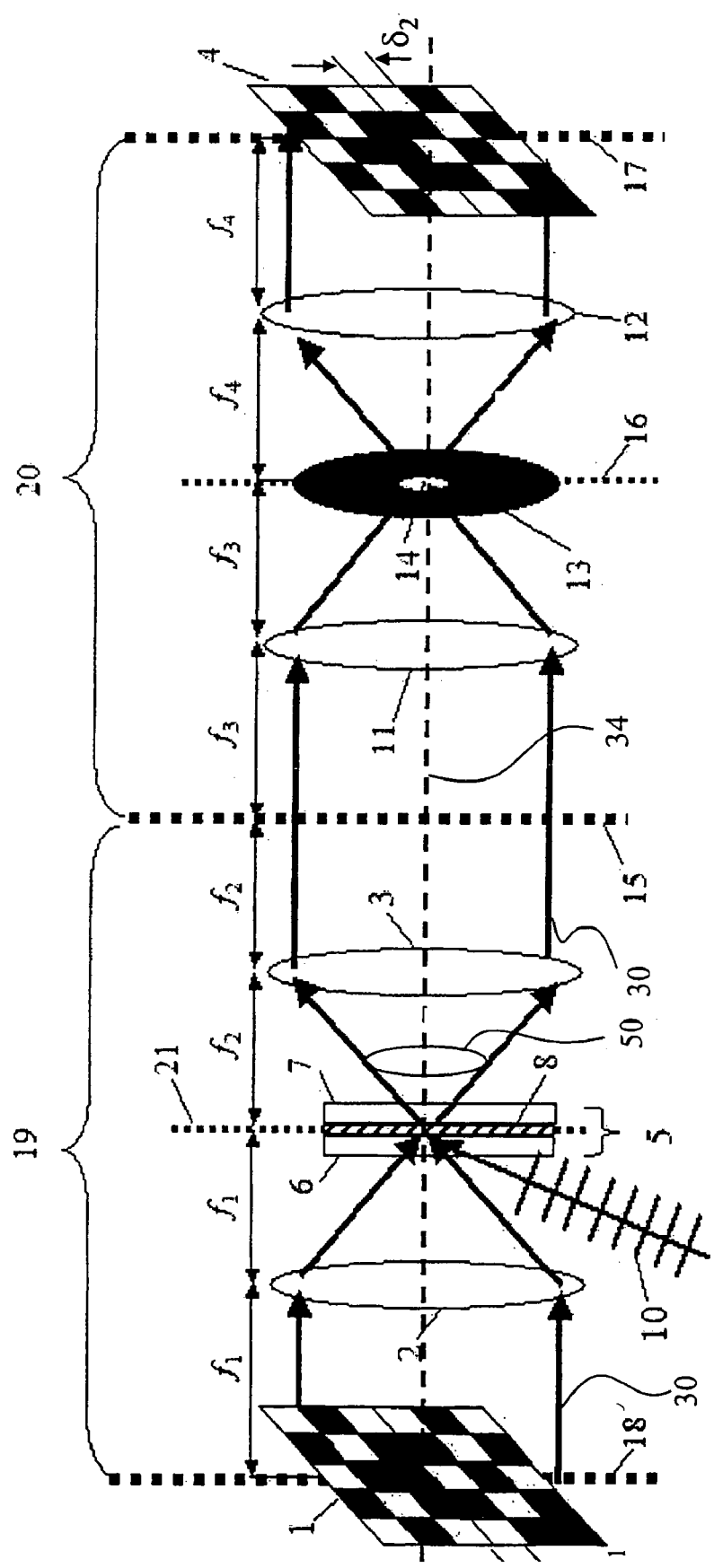
FIG. 2 is a schematic diagram of one embodiment of an apparatus of the present invention.

As used herein, the term "lens element" refers to one or more elements having optical power, such as lenses, that alone or in combination operate to modify an incident beam of light by changing the curvature of the wavefront of the incident beam of light. Lens elements 2 and 3, for example, can comprise more than one lens. One skilled in the art will appreciate that FIGS. 1 and 2 are not drawn to scale and do not depict actual ray trajectories within the lens elements.

The cross-sectional area of signal beam 30 is typically minimized in Fourier (focal) plane 21. In accordance with the fundamental Nyquist aperture for coherent light, the cross-sectional area has a diameter of $d=2\lambda f/\delta$, where $\lambda$ is the wavelength of the light, f is the focal distance of first Fourier transform lens element 2, and $\delta_1$ is the pitch of SLM 1. As used herein, the pitch of a pixel array is defined as a center-to-center distance between two adjacent pixels. Positioning recording material 8 at or near the focal plane 21 of Fourier transform lens element 2 typically minimizes the image size of the recorded area and, therefore, maximizes the resulting areal data density. Recording holograms at fractional Fourier planes that are in front of or behind the Fourier plane and are near the Fourier plane, however, can improve the fidelity of recorded information substantially (see G. Goldman, Optik, Vol. 34, No. 3, 254-267 (1971)) due to there being a more uniform intensity distribution of the object field over the recording area (i.e. the amplitude of the intensity variation of the object field, which comprises the components of the Fourier spectrum as a function of distance from the center of the Fourier transform, is reduced when the distance between the Fourier plane- and the recording plane is increased).

A convenient way to carry out multiplexing can be understood with reference to FIG. 1. In FIG. 1 optical axis 34 of signal beam 30 is incident normal to the plane of recording material 8. Alternatively, the optical axis 34 of the signal beam can be incident at oblique angles to the normal to the plane of the recording material 8. A collimated reference beam (9 or 10) is incident to the plane of the recording material 8 with an angle of incidence $\theta$, that typically is a relatively large angle of incidence, so as to overlap signal beam 30 in the plane of recording material 8. A series of angle-multiplexed holograms can be first recorded in the same volume of medium 8 at a selected storage location. Each hologram in this series is recorded with a reference beam that has a distinct angle of incidence with respect to the normal to the recording material 8, such as, for example, reference beams 9 or 10. By way of example, after each series of angle-multiplexed holograms is complete or partially complete in said selected storage location, recording material 8 is rotated by several degrees about optical axis 34 of signal beam 30 or alternatively the optical axis of reference beam 9 or 10 is rotated with respect to optical axis 34 of signal beam 30 so that the plane containing said reference and signal beams is a different plane rotated with respect to the former (azimuthal or peristrophic multiplexing), and a new angle multiplexing series or partial series is recorded. Alternatively, a sequence of recordings can be implemented first for a group of rotation angles of the recording material about the optical axis 34 of signal beam 30 or alternatively about an axis that is tilted with respect to optical axis 34 of signal beam 30 or alternatively the optical axis of reference beam 9 or 10 is rotated with respect to optical axis 34 of signal beam 30 so that the plane containing said reference and signal beams is a different plane rotated with respect to the former, corresponding to azimuthal or peristrophic multiplexing, for a distinct angle of incidence $\theta$ of reference beam 9 (or 10) with respect to the normal to recording material 8. Then, recording can be repeated for each distinct angle of incidence $\theta$ of a reference beam for each of the angles of azimuthal multiplexing. Alternatively, the angles for the series of azimuthally multiplexed holograms can be partially complete for a distinct angle of incidence $\theta$ of a reference beam and one or more of a series of angle-multiplexed holograms can be recorded each at another distinct angle of incidence $\theta$ of a reference beam. Several hundred independent holograms can be multiplexed in relatively thin recording material using this combination of multiplexing procedures; resulting data densities can exceed 100 bits per square micron (see D. Waldman et al., "CROP holographic storage media for optical data storage greater than 100 bits/$\mu m^2$", Organic Holographic Materials and Applications, Vol. 5216-1, SPIE Annual Meeting, San Diego, August 2003). Implementation of the above-described combination of multiplexing procedures achieves highest areal density for a given thickness of the recording material when the range of interbeam angles (i.e. angles between signal beam 30 and any one of reference beams 9 or 10) used for the angle multiplexing procedure is the largest that the optical system can accommodate. Consequently, it is most practical to use the smallest interbeam angle possible (i.e. the smallest interbeam angle for the collimated reference beam that clears the lens element relaying the object beam), so as to be able to record with the largest number of distinct angles of incidence $\theta$ of the reference beam and thus record the largest number of multiplexed holographic images in a selected storage location. It is preferable that the sequence of interbeam angles used for angle-multiplexing in a selected storage location be such that the smallest interbeam angles occur at the beginning of the recording sequence and the largest at the end of the recording sequence.

Increasing areal density can be achieved in a number of ways. Areal data density is increased as the total number of pixels in the SLM data page increases, with focal distance f1 of first Fourier transform lens element 2 and the pixel pitch $\delta_1$, remaining the same (see FIG. 1). Areal data density is increased as the size of Nyquist aperture of the Fourier transform of the SLM in the plane of the recording material 8 decreases, such as by diminution of the focal distance for first Fourier transform lens element 2 (as well as by increasing pitch for the pixels of SLM 1). Increasing the number of multiplexed holograms recorded in the same storage location also increases the areal density.

The numerical aperture (NA) of the first Fourier transform lens element 2 can be increased while maintaining the same optical field with the same clear aperture to accommodate the same page size, and in this manner decrease said focal distance from the said first lens to the plane of the media. This approach is generally required and typically implemented to reduce the cross sectional area of the signal beam in the recording plane and thereby increase the areal density of the storage location.

Consequently, an HDS system that operates to maximize the data density, for a recording material of a particular thickness, uses the highest NA lenses for the Fourier transform lens pair that a 4f optical imaging system can accommodate. Unfortunately, the use of high NA (NA ≦0.2 for HDS systems) lenses, such as in the conventional 4f optical system wherein the first and second Fourier transform lens element have substantially equal focal lengths and values of NA, can introduce several factors that contribute to the substantial decreases of signal-to-noise ration (SNR) in the HDS system. Referring again to FIG. 1, when NA of second Fourier transform lens element 3 is increased, so is the amount of scattered light that is imaged onto detector plane 15. Light scattered from media 8 or media substrates 6 and 7, along with light scattered from optical and mechanical surfaces of the assembly, is captured more efficiently by high NA optics due to the shorter working distance (i.e. the distance between the rear surface of the lens and the focal plane of the lens) of these high NA lenses and their larger acceptance field. During recording, the scattered light can be recorded in the media, and during hologram read-out the scattered light is imaged onto pixilated detector 4 and recognized as noise. This phenomenon is especially evident in thin photopolymer-based media systems where a non-90 degree interbeam angle must typically be used for the recording geometry. A 90 degree interbeam can be realized for the recording geometry in thin photopolymer-based media systems, but this would require, by way of example, coupling the light for recording into the media through facets that are part of the surface of the substrates of the media or of the recording material.

The optical noise level attributed to scattered light, $\epsilon_{scatter}$, measured in terms of diffraction efficiency (i.e. a ratio of intensities of the diffracted light and the impinging light), η, scales as the square of the NA as shown in Eqn (1).

$$\eta_{scatter} \approx 4NA^2 \epsilon_{scatter} \quad (1)$$

In order to maximize the density of data stored, however, HDS systems must maximize the signal-to-noise ratio (SNR) of the media/drive system, where SNR is defined as $$SNR = \frac{\mu_1 - \mu_2}{\sqrt{\sigma_1^2 + \sigma_2^2}} \quad (2)$$

where $\mu_1$ and $\mu_2$ are the means of the intensity values detected, and $\sigma_1$ and $\sigma_2$ are the standard deviations of the intensity values detected, for binary zero and binary one values, respectively. Maximizing SNR, however, becomes increasingly difficult as NA is increased so as to achieve the highest storage density for the HDS system.

To circumvent the problems of noisy optical systems, large diffraction efficiencies (a physical value related to brightness or signal strength of each hologram) are required for each of the multiplexed holograms in order to achieve acceptable SNR ratios. The dynamic range (a physical value related to the maximal number of detectable holograms that can be recorded), $v_M$, for a total of M multiplexed holograms is, however, limited for most practical recording materials. The dynamic range can be expressed as shown in Eqn. (3):

$$v_M = \sum_{i=1}^{M} \sqrt{(\eta_i)}, \quad (3)$$

where $\eta_i$ is a diffraction efficiency if the i-th hologram and where $$\eta_i \sim \frac{1}{M^2}.$$

It follows, therefore, that as one increases the maximum number of holograms M stored at any one location so as to increase areal data density, the diffraction efficiency of each one hologram decreases, reducing the SNR. Accordingly, to effectively maximize areal data density by combining use of high NA Fourier transform lenses and large numbers of multiplexed holograms, each of relatively low diffraction efficiency, it is necessary to suppress optical noise at the detector plane.

The disclosed invention is an apparatus for holographic data storage (HDS) systems that comprises optical components such as one or more lenses and/or one or more mirrors having moderately high to high numeric aperture (NA), defined for HDS systems as NA of not less than 0.2. The system achieves high areal density of stored information, defined as not less than 24 bits/$\mu m^2$, with acceptable signal-to-noise ratio (SNR), defined as SNR corresponding to a raw bit-error-rate (BER) of ≦10E-2. In one embodiment, the stored information comprises multiplexed holograms. The apparatus of the present invention comprises an optical system that can improve areal data density in holographic data storage systems by reducing optical noise at the detector. The optical noise can originate, for example, due to scattered and stray light, light from the undiffracted reference beam and image misalignment.

The apparatus of the present invention operates to achieve high areal density with acceptable SNR independent of the recording method used to record the holograms and independent of the type of reference beam (i.e. collimated, spherical, elliptical, speckle, phase-code, etc.) used for recording the holograms. If the multiplexed holograms are used, they can be recorded by any method known to one skilled in the art including, but is not limited to, in-plane, out-of-plane angle or peristrophic (azimuthal) multiplexing, or in-plane or out-of-plane shift multiplexing, spatial, wavelength, phase-coded or correlation multiplexing, or combinations thereof. The method and apparatus of the present invention can further be used to achieve high areal density of stored information with acceptable SNR when the recording geometry of the reference beam and object beam comprises a non-90 degree interbeam angle, which would typically be the case for photopolymerizable, photochromic, or organic photorefractive recording media. The method and the apparatus of the present invention can be utilized to reconstruct and detect, with acceptable SNR, multiplexed holograms having diffraction efficiency of $10^{-3}$ or less, stored at high areal density as well as to record such holograms.

Referring to FIGS. 1 and 2, if the NAs of lens elements 2 and 3, used during recording in the holographic imaging system, are sufficiently large, then significant optical noise degrades the SNR of the diffracted image. The apparatus and the methods of the present invention can substantially reduce or eliminate optical noise. The optical noise can originate from various sources including, but not limited to: light scattered from the media and other optical surfaces, light that originates from the undiffracted reference beam, and image misalignment. The noise contribution from any one of these sources can cause a significant decrease in SNR levels during hologram read-out, and can be especially problematic when reading holograms that were recorded at high areal density, since such holograms typically have low diffraction efficiency. Without being limited by any specific theory, it is believed that primary sources of noise include, but are not limited to light scattered by the components of the system in the direction of detector 4, including scattered light from the media, substrates and other optical surfaces, other sources of stray light in the HDS system such as light from reflections off of optical surfaces and mounting fixtures, and undiffracted reference beam 10 (or 9).

In one embodiment, the present invention is an apparatus for reading or writing holographically stored information, comprising a holographic imaging system for recording and reconstructing a holographic image, having a first numerical aperture and a first focal length and an additional optical system for filtering a holographic image, having a second numerical aperture and a second focal length. The additional optical system can also be referred to as an "optical noise filter". In one embodiment, the numerical aperture of the additional optical system is less than the numerical aperture of the holographic imaging system. In another embodiment, the focal length of the additional optical system is greater than the focal length of the holographic imaging system. In yet another embodiment, the numerical aperture of the additional optical system is less than the numerical aperture of the holographic imaging system and the focal length of the additional optical system is greater than the focal length of the holographic imaging system. As used herein, when applied to an optical system or a combination of lenses, the terms "numerical aperture" and "focal length" mean effective numerical aperture and effective focal length, respectively, of such an optical system or a combination of lenses. The numerical aperture or the focal length of the additional optical system are selected to substantially filter out scattered light, stray light or undiffracted reference beam.

Referring to FIG. 2, the holographic imaging system of the apparatus comprises an HDS optical system with a traditional 4f optical design (e.g. a holographic imaging system as depicted in FIG. 1). Additional optical system 20, shown in FIG. 2, is inserted into the traditional 4f optical system of the HDS system.

The traditional 4f optical system of the HDS system, also referred herein as a holographic imaging system, comprises first and second imaging lens elements 2 and 3 and can further include spatial light modulator (SLM) 1, holographic media 5 and detector 4.

Additional optical system 20 includes first and second additional lens elements 11 and 12 and an optional apertured filter 13 having aperture 14. Additional optical system 20 operates during readout of holographically stored information to substantially reduce or eliminate sources of optical noise that are inherent to HDS systems with moderately high and high NA.

In one embodiment, aperture 14 of apertured filter 13 is adjustable. An example of an adjustable aperture is an iris diaphragm. In one embodiment, the size and/or the shape of aperture 14 are selected to substantially filter out scattered light, stray light, or undiffracted reference beam.

In the embodiment shown in FIG. 2, additional optical system 20 is inserted between component 3 (the second imaging lens element) and component 4 (the detector) of a holographic imaging system for reconstructing a holographic image. In one embodiment, the holographic imaging system, is a 4f system designed for 1:1 imaging of SLM 1 onto detector 4. In another embodiment, the holographic imaging system does not comprise a conventional 4f optical design and provides for non-1:1 imaging of SLM 1 onto detector 4. This would be desirable in certain cases when pixel size of SLM 1 differs from pixel size of detector 4.

In one embodiment (see FIG. 2), apertured filter 13 is positioned at or near focal plane 16 of first additional lens element 11 and can operate as a spatial filter. The size and the shape of aperture 14 can be adjusted. In one embodiment, apertured filter 13 is an iris diaphragm. Referring again to FIG. 2, in one embodiment, additional optical system 20 comprises a 4f optical system. The object plane of additional optical system 20 is positioned to coincide with image plane 15 of the holographic imaging system. First additional lens element 11 of the additional optical system has a focal length f3 and second additional lens element 12 of the additional optical system has a focal length f4. In one embodiment, f3=f4, thereby providing 1:1 imaging of SLM 1 onto detector 4. In another embodiment, f3≠f4. In one embodiment, first and second additional lens elements 30 elements 11 and 12 are substantially telecentric.

Turning again to the embodiment shown in FIG. 2, the holographic imaging system includes first and second imaging lens elements 2 and 3 having focal lengths f1 and f2, respectively. In a preferred embodiment, f1=f2, thereby providing for 1:1 imaging of SLM 1 onto detector 4. In one embodiment, f1=f2 and f3=f4. In one embodiment, first and second imaging lens elements 2 and 3 are substantially telecentric.

As described above, in a preferred embodiment of the present invention, either the numerical aperture of the additional optical system is less than the numerical aperture of the holographic imaging system or the focal length of the additional optical system is greater than the focal length of the holographic imaging system or both. Accordingly, in one embodiment, f3 is greater than f2.

A number of possible combinations of focal lengths may be used for f1, f2, f3, and f4. For instance the first and the second imaging lens elements can be separated by a distance of f1+f2 along the optical path of the signal beam, or by a distance that is not equal to the sum of f1+f2 along the optical path of the signal beam such as may be needed due to tolerance specifications of optical elements. Additionally, the first and the second additional lens elements can be separated by a distance of f3+f4 along the optical path of the signal beam, or by a distance that is not equal to the sum of f3+f4 along the optical path of the signal beam such as may be needed due to tolerance specifications of optical elements. For any combination of these conditions other possible optical arrangements are possible such as f1=f2 or f1≠f2 or f3=f4 or f3≠f4, and any combinations thereof, such as the arrangement comprising f1=f2 and f3=f4 when f3>f2, or f1=f2 and f3≠f4 when f3>f2 such as may be needed to provide magnification or demagnification.

Holographic recoding media 5 is positioned at or near Fourier transform (focal) plane 21 of first imaging lens element 2. Holographic recording media 5 comprises, by way of example, a layer of photopolymerizable material 8 disposed between two optically transmissive planar substrates 6 and 7. The thickness of the holographic recording material is typically between about 200 µm and 1.5 mm.

In one embodiment of the present invention, it is desirable to magnify or demagnify the SLM image. This may be desired when pitch $\delta_1$ of the pixels of spatial light modulator 1 is not equal to the pitch or some whole number factor of the pitch of pixels $\delta_2$ of detector 4 (see FIG. 2). In this embodiment, the optical components of the additional optical system 20, such as lens elements 11 and/or 12, can magnify or demagnify the image of SLM 1 to correctly project it onto detector 4.

Figure 5A:
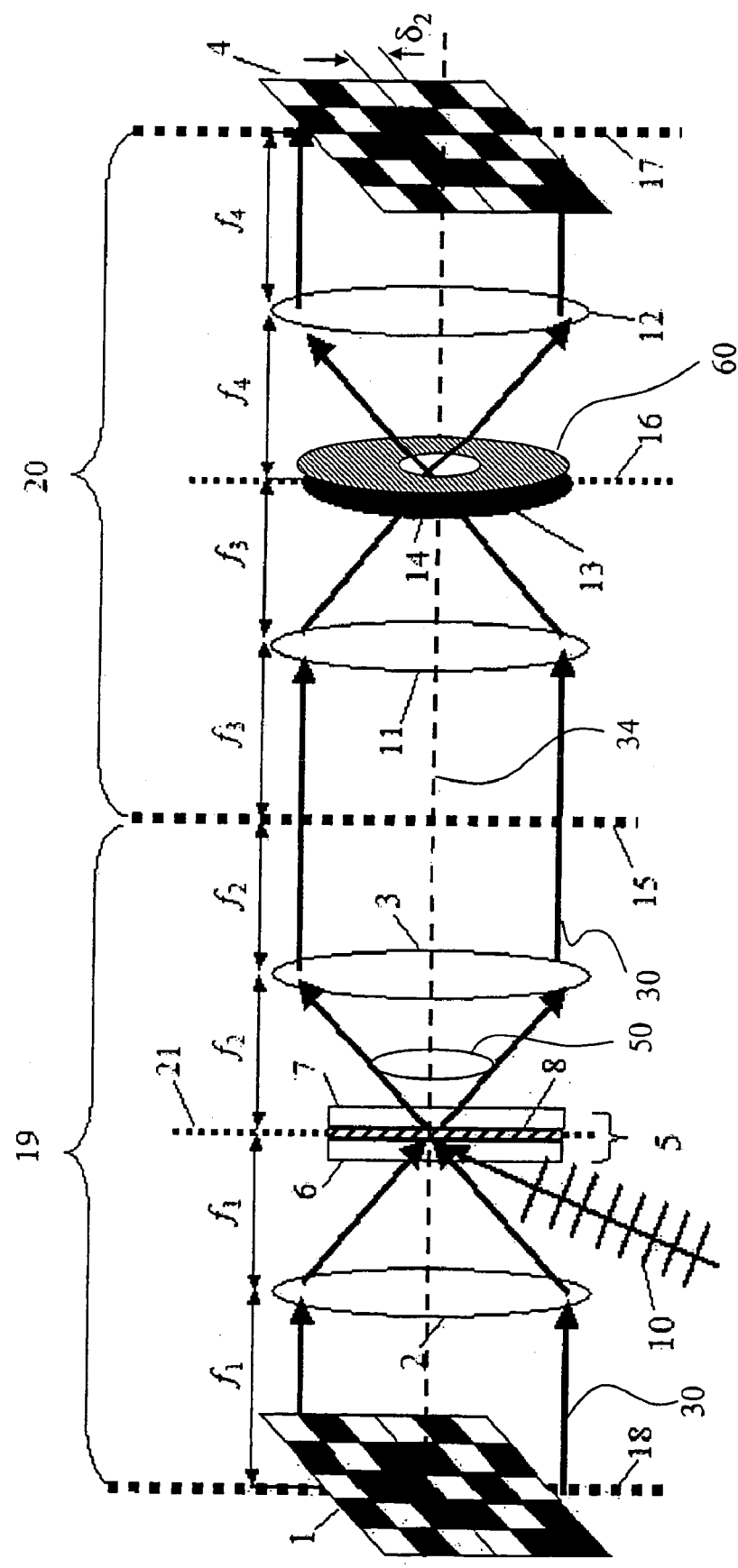
FIG. 5A and FIG. 5B are schematic diagrams of embodiments of the device of the present invention that include an additional apertured filter.
Figure 5B:
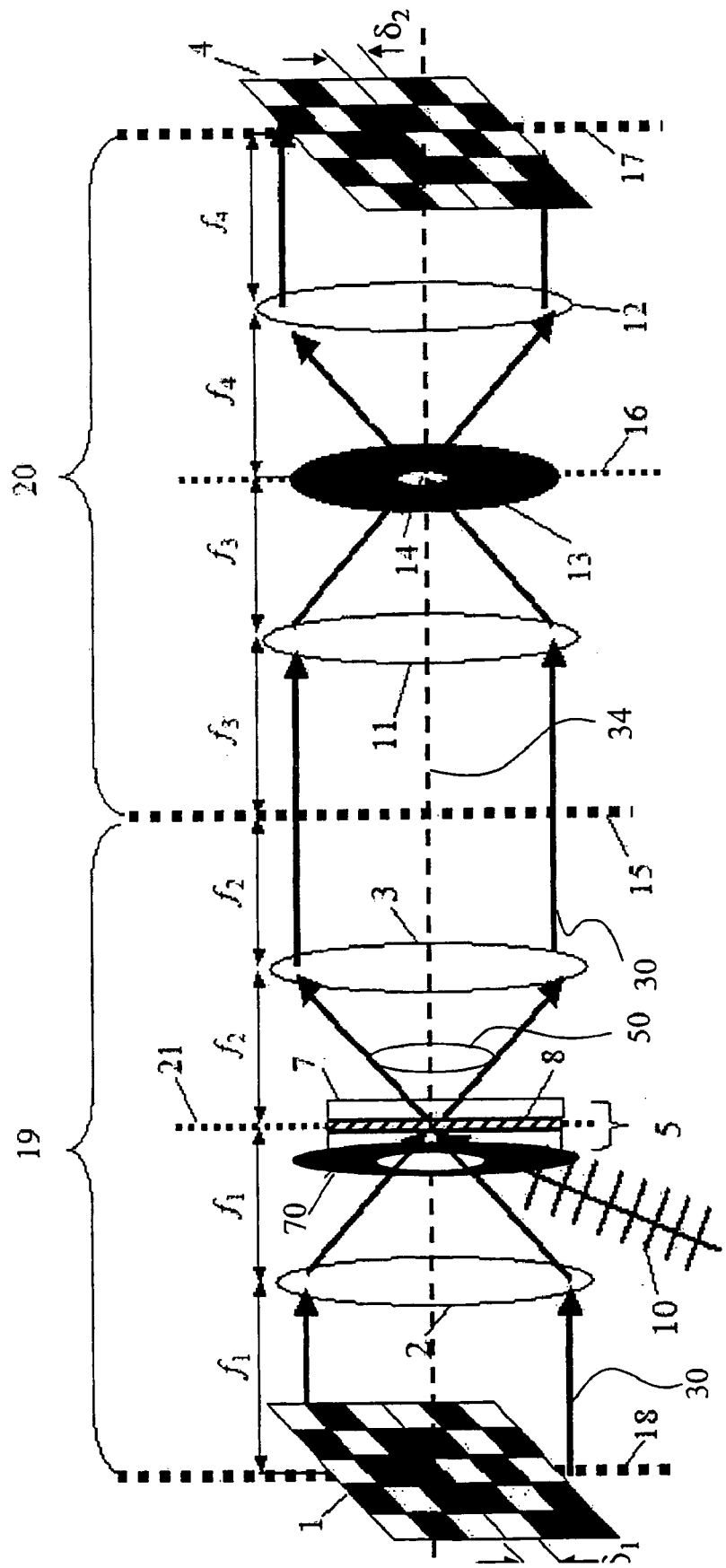

In another embodiment, the apparatus of the invention further includes a second apertured filter disposed along optical path 34 of signal beam 30. In one embodiment, shown in FIG. 5A, second apertured filter 60 is disposed between first and second additional lens elements 11 and 12 along optical path 34. In this embodiment first apertured filter (13) operates as a phase contrast filter and said second apertured filter (60) operates as a noise filter. In another embodiment, shown in FIG. 5B and, partially, FIG. 6, the second apertured filter 70 is disposed between first imaging lens element 2 and holographic recording media 5. This configuration, is particularly useful for filtering out higher orders of the amplitude distribution of the Fourier transform at the recording plane so as to prevent undesirable consumption of the dynamic range of the recording material outside of the storage location.

During typical holographic recording of digital data pages, an image comprising data information for the signal beam is displayed by spatial light modulator (SLM) 1. The SLM can operate to modulate either the amplitude or the phase distribution of an impinging laser beam (here, beam 30; see FIG. 2). The SLM can be reflective or transmissive, the latter type shown schematically in FIGS. 1 and 2. The modulated signal beam (beam 30) is focused by Fourier transform lens element (first imaging lens element) 2, that operates to relay the optical Fourier transform of the SLM pattern comprising data information to plane 21 located one focal length f1 from first imaging lens element 2. Reference beam 9 or 10, coherent with signal beam 30, propagates towards and interacts with signal beam 30 at selected storage location at photopolymerizable recording material 8. One skilled in the art of holographic data storage will appreciate that there is a plurality of addressable storage locations in media 5. An interference pattern is formed by the overlap of signal beam 30 and reference beam 10 within media 8. Several to many co-locational or partially overlapping holograms can be recorded in a selected storage location using various multiplexing techniques that are readily apparent to those skilled in the art.

Figure 3:
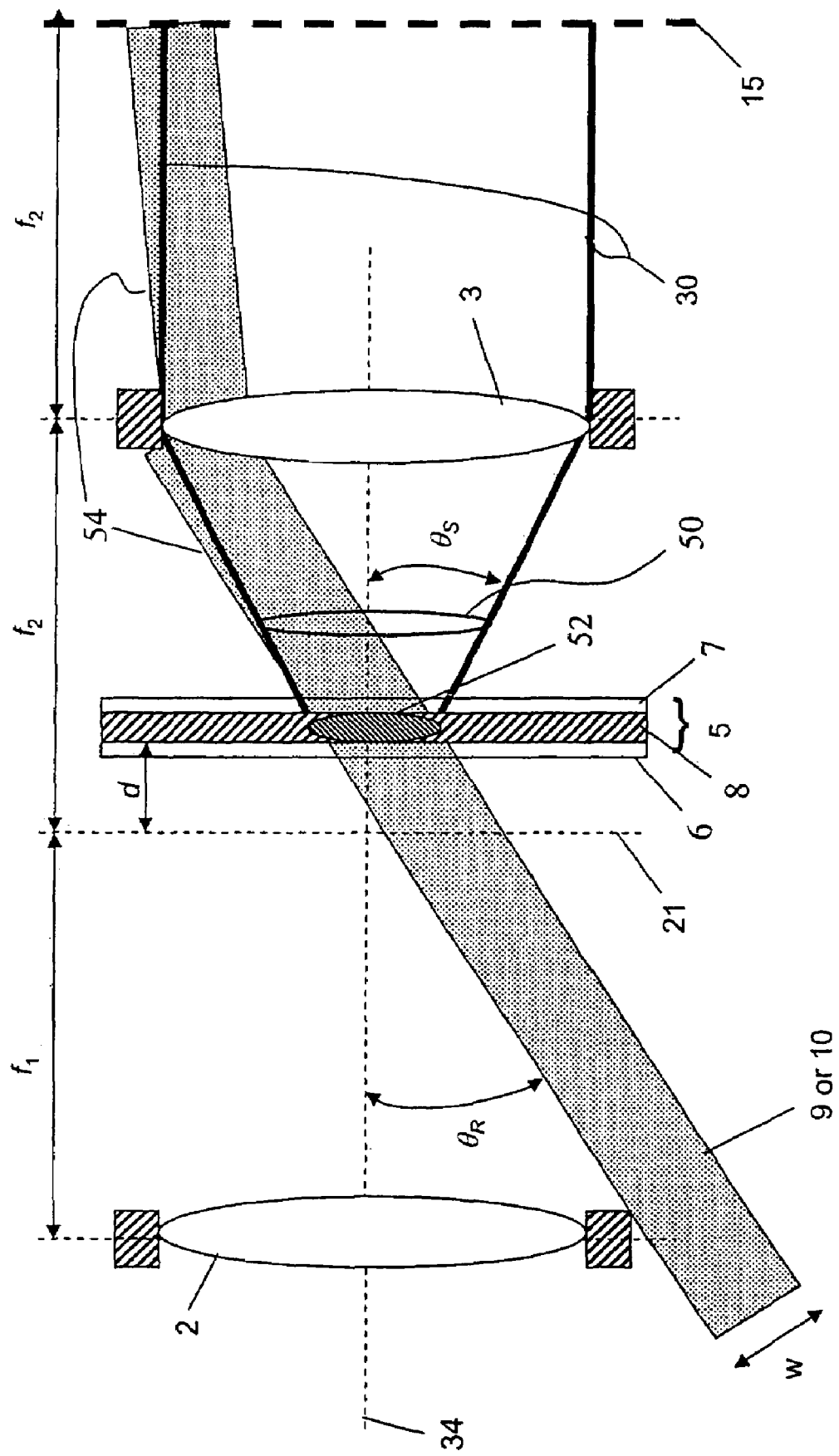
FIG. 3 depicts a portion of a device of FIG. 2 where the holographic recording media has been offset. It shows a schematic diagram of exemplary optical trajectories of the diffracted and undiffracted portions of a reference beam within a 4f% like optical design.

Reconstruction of a hologram for reading is schematically depicted in FIG. 3. FIG. 3 represents a portion of a device of FIG. 2 with a position of media 5 offset by a distance d with respect to focal plane 21. The read-out of a hologram or a series of holograms requires that reference beam 10, substantially identical to the recording reference beam 9 or 10 (see FIG. 2), impinge upon the selected hologram of interest. The reference beam diffracts from the diffraction grating 52 (formed in media 8 during recording) with a diffraction efficiency that generally depends upon the thickness of the hologram, the refractive index modulation of the hologram, and the recording geometry. The diffracted light forms image cone 50 and propagates through the inverse Fourier transform lens element (second imaging lens element) 3 of the holographic imaging system. An image from the recorded interference pattern is relayed to image plane 15 by the inverse Fourier transform lens element (second imaging lens element) 3. The holographic imaging system can further include a detector, such as detector 4 in FIG. 2. Absent the additional optical system of the present invention, detector 4 can be placed at image plane 15, as shown in FIG. 1.

However, a portion of the impinging reference beam, depicted as beam 54 in FIG. 3, does not diffract and can further be collected by second imaging lens element 3. Additionally, scattered light from various sources that include the undiffracted portion 54 of reference beam 10 as well as other optical noise can be collected by second imaging lens element 3 and degrade the SNR. (These other sources of optical noise are not shown in FIG. 3, but are discussed below.)

Accordingly, in one embodiment, the present invention is a method of reading a holographically recorded image. The method comprises directing reference beam 9 or 10 into a holographic imaging system that includes holographic recording media 5, at a selected storage location on media 5 comprising one or more holographically recorded images, thereby reconstructing a signal beam. The holographic imaging system has a first numerical aperture and a first focal length. The method further includes directing the reconstructed signal beam through additional optical system 20, having a second numerical aperture and a second focal length. The second numerical aperture is smaller than the first numerical aperture. In passing through additional optical system 20, the reconstructed signal beam is filtered. The filtered signal beam is detected by detector 4.

In one embodiment, the holographic recording media stores fully or partially overlapped multiplexed holograms in at least one storage location on the holographic recording media. These modes of multiplexing are carried out by aforementioned methods such as either changing the incident angle of the reference beam or by moving the holographic recording media by a distance that is less than the characteristic size of a storage location. In another embodiment, the multiplexed holograms are recorded so that the first hologram in a sequence of multiplexed holograms is recorded with a smaller interbeam angle than holograms recorded later in the sequence.

Referring to FIG. 2, in one embodiment, additional optical system 20 blocks a significant percentage of light scatter that is from outside imaging cone 50 of the holographic imaging system. Those skilled in the art can select from a variety of methods to increase working distance of the optical system of the present invention so as to reduce the contributions of noise that otherwise are imaged onto detector 4.

Referring to FIG. 3, a practical holographic imaging system will generally have several sources of optical noise from scattered light. These include light scattered from media substrates 6 and 7, recording material 8, surfaces of lens elements 2 and 3, and mechanical fixtures (not shown). An appreciable proportion of this noise from scattered light can arise from the polymer structure in the recording material and/or polymeric substrates and/or from inclusions or bubbles in glass substrates. Consequently, the intensity of forward scattered light has contributions that are not spherically symmetrical and depends on $\theta$, the angle between the continued propagation direction of the undiffracted reference beam 9 or 10 and the direction of propagation of scattered light, as $1/\sin^2(\theta/2)$ or $(1+\cos^2\theta)/2$. Preferably, the additional optical system 20 blocks forward-scattered light in the range of about $\theta=0°$ to about $\pm 5°$, more preferably, in the range of about $\theta=0°$ to about $\pm 10°$, and even more preferably about $\theta=0°$ to about $\pm 20°$ from the propagation direction of the undiffracted reference beam 9 or 10. This is achieved by selecting NA and/or focal lengths of lens elements 11 and 12 as well as selecting the size of the spatial filter 13 and the size of aperture 14.

Referring to FIG. 3, when using amplitude-modulated SLM, the Fourier transform spectra of the SLM image typically includes a substantially dominant constant component (so called DC component) that is capable of over-exposing the photopolymer media during such recording. Therefore, when recording is made using an amplitude-modulated SLM, it is typically necessary to position recording media 5 away from Fourier plane (focal plane) 21 along optical axis 34 in order to homogenize the amplitude distribution of the Fourier transform of the object field and achieve acceptable SNR. The offset is shown as distance d behind the Fourier plane 21 in FIG. 3, which is a preferable geometry that provides for using the minimum interbeam angle for Reference beam 9 or 10 and thus the smallest nominal slant angle as well as the largest available range of reference beam angles. This results in undiffracted portion 54 of reference beam 9 or 10 being able to enter inverse Fourier transform lens element (the second imaging lens element) 3 of the holographic imaging system.

One skilled in the art will appreciate that during reconstruction of a hologram recorded with such an offset, the media must be placed at the same offset position as well. Consequently, in a one embodiment of the apparatus and method of this invention media 5 is offset from Fourier plane (focal plane) 21 of the holographic imaging system by distance d. In a more preferred embodiment, recording media 5 is positioned behind the Fourier plane (focal plane) 21 along optical axis 34 in the direction closer to inverse Fourier transform lens element (second imaging lens element) 3. As a result, a portion of the undiffracted reference beam 9 or 10 can enter the second imaging lens element 3.

By selecting NA and/or focal lengths of lens elements 11 and 12 as well as selecting the size of apertured filter 13 and size of aperture 14, undiffracted reference beam 54 is prevented from being imaged onto detector 4.

It can also be advantageous to minimize the mean angle between the reference beam 9 or 10 and the signal beam 30, referred to as the interbeam angle, in order to reduce the effect of transverse (thickness direction) shrinkage on image fidelity (see FIG. 2) during recording. Such shrinkage occurs during holographic recording in photopolymerizable media. This is particularly the case when implementing planar-angle multiplexing or a combination of it with azimuthal multiplexing. Firstly, diminishing the interbeam angle causes the full-width-half-height (FWHH) of the angular selectivity curve to broaden for a particular thickness of the recording material. Since the magnitude of transverse shrinkage will be largest for the first hologram recorded in photopolymerizable recording media, in a sequence of planar-angle multiplexed holograms that are recorded in the same storage location, the angular deviation of said first hologram from the Bragg recording condition will be larger than for holograms recorded later in the sequence. It is therefore desirable to record first holograms with the smallest interbeam angle. This will allow to offset larger angular shifts from the Bragg condition of recording with the largest FWHH of the corresponding angular selectivity profile. Secondly, the angular deviation for the smaller interbeam angle, for a given shrinkage level, will be smaller due to the hologram having a smaller slant angle. Thirdly, diminishing the minimum interbeam angle increases the overall range of reference beam angles that can be used to implement planar-angle multiplexing, and thus provides the means to achieve as large a multiplexing number as possible for a given thickness of the recording material. Fourthly, photopolymerizable media is generally pre-conditioned to pre-shrink the media to the correct start state before recording information that comprises multiplexed holograms that, by way of example, are digital data page holograms. This pre-conditioning reduces the dynamic range that could otherwise be used for recording information. Minimization of the interbeam angle reduces the effect of volume shrinkage allowing one to reduce the extent of pre-conditioning and preserve dynamic range for recording information.

Therefore, in a preferred embodiment of the apparatus of this invention (see. FIG. 3) recording media 5 is positioned behind Fourier plane (focal plane) 21, and, if using angle multiplexing, the mean interbeam angle (angle $\theta_r$ in FIG. 3) is reduced to the smallest angle that clears the optical components of the device. These two advantageous conditions, however, can cause a large portion of the undiffracted reference beam 54, as well as light scattered at angles close to the continued propagation direction of reference beam 10, to enter inverse Fourier transform lens element (second imaging lens element) 3 of the holographic imaging system.

The problem of preventing undiffracted reference beam from being imaged onto the detector does not arise in the case of low areal data density systems. In such systems, lens elements have low NA and substantially longer working distances. Referring, by way of example, to FIG. 1, the undiffracted portion of the reference beam 9 or 10 generally does not travel through the inverse Fourier transform lens element (the second imaging lens element) 3. Even in cases, where the undiffracted portion of the reference beam does travel through lens element 3, the entrance angle of the reference beam 9 or 10 is larger than the entrance angle of the object (signal) beam 30. Therefore, after being relayed by the lens element 3, the reference beam 9 or 10 will be imaged outside the image of the hologram at the detector 4. In this case, the undiffracted reference beam 9 or 10 would have exited the optical system of the invention, and, therefore the SNR of the system would not be compromised by the undiffracted light. Similarly, a portion of light scattered from reference beam 9 or 10 that enters the second imaging lens element 3, and that has a substantially higher intensity at angles close to the continued propagation direction of the reference beam, will be imaged to a location outside of the image of the hologram at the detector 4. In either case, the high intensity portion of the scatter light essentially exits from the optical system and therefore the SNR of the system is not compromised.

HDS systems comprising high NA optical components that have substantially short focal lengths and correspondingly short working distances, however, do not have enough distance between inverse Fourier transform lens element (second imaging lens element) 3 and detector 4 to allow the undiffracted portion of the reference beam, or light scattered from the reference beam at angles close to the continued propagation direction of the reference beam, to exit the optical path before entering the detector in the area corresponding to information diffracted by the hologram. Referring, for example, to FIGS. 2 and 3, placing detector 4 at plane 15 would not allow undiffracted portion of the reference beam 54 or light scattered from reference beam 10 at angles close to the continued propagation direction of reference beam 10, to exit the optical path before entering the detector in the area corresponding to the image of the hologram. Consequently, the SNR of the system can be seriously compromised such that information comprising holograms cannot be adequately read with reasonable SNR, and thus high areal density of stored information is not achieved.

Referring now to FIG. 2, by selecting NA and/or focal lengths of first and second additional lens elements 11 and 12 as well as selecting the size of apertured filter 13 and the size of aperture 14, undiffracted reference beam 9 or 10 is prevented from being imaged onto detector 4.

In one embodiment, the NA of the additional optical system is reduced relative to the NA of the holographic imaging system. This prevents undiffracted reference beam 9 or 10, as well as light scattered from reference beam 9 or 10 at angles close to the continued propagation direction of the reference beam, from entering the clear aperture of first additional lens element 11.

In another embodiment, focal length $f_3$ of first additional lens element 11 is long enough to allow undiffracted reference beam 9 or 10, as well as light scattered from reference beam 9 or 10 at angles close to the direction the continued propagation of the reference beam, to exit the HDS system before being collected by first additional lens element 1. Alternatively, focal length $f_3$ is selected so that, even if collected by first additional lens element 11, undiffracted reference beam (9 or 10) and light scattered from the reference beam at angles close to the direction the continued propagation of the reference beam are blocked by apertured filter 13. Those skilled in the art can choose a particular shape and size for the aperture 14 to optimize SNR of the HDS system for read-out of holograms, said holograms preferably multiplexed so as to achieve high storage density of information and thus having low diffraction efficiency.

Figure 4B:
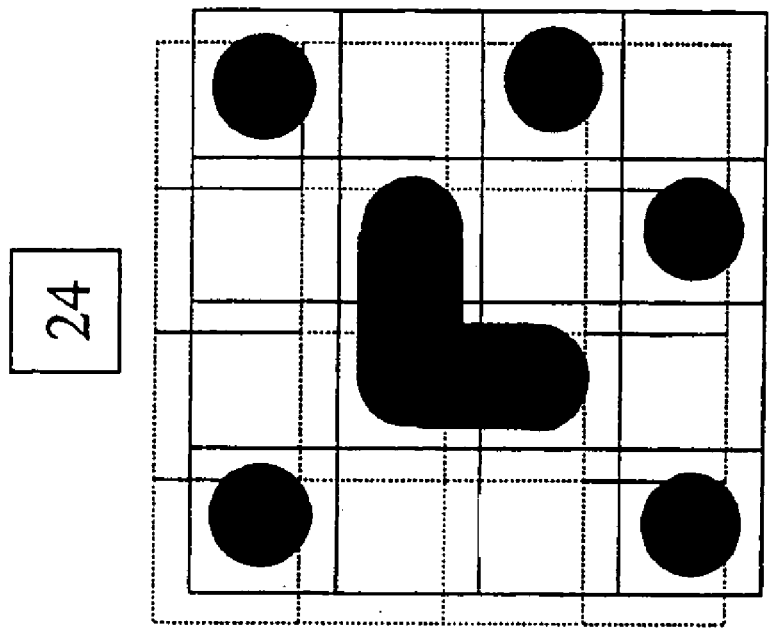
FIG. 4B is a schematic diagram showing an exemplary result of filtering optical noise due to pixel misregistration using the apparatus of the present invention.
Figure 4A:
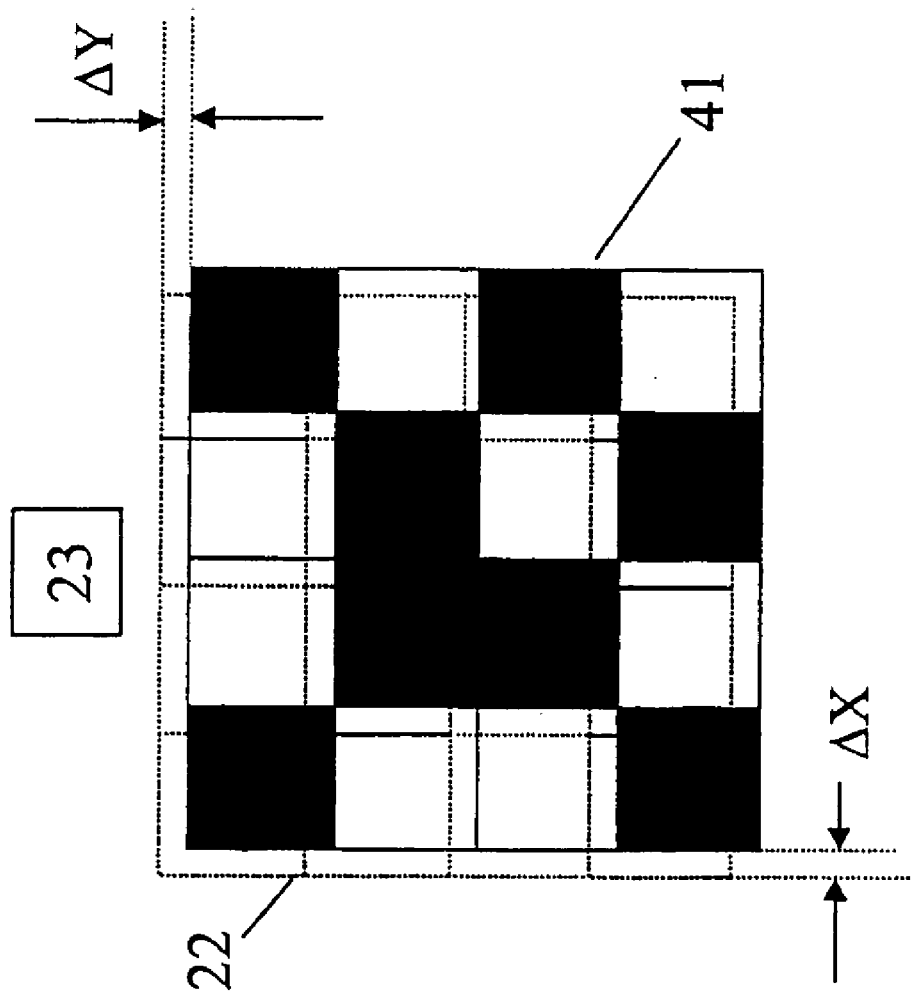
FIG. 4A is a schematic diagram showing pixel misregistration due to misalignment of the imaged pixels and the pixels of the detector.

Apertured filter 13 can be used in another embodiment to reduce noise introduced by data page misalignment such as misalignment on a subpixel scale. FIG. 4A shows diffracted data page 41 impinging on detector 4 such that it exhibits pixel misregistration. Pixel misregistration can be measured in fractions of characteristic pixel dimension, $\Delta X$ and $\Delta Y$. Pixel misregistration can be due to factors including, but not limited to, media wedge, media tilt, servo inaccuracy, and/or lens misalignment. Use of high NA optical components typically amplifies the likelihood of pixel misregistration. An apertured filter, such as apertured filter 13, can be used to reduce or substantially eliminate effects of pixel misregistration that is on the order of a fraction of the pixel dimension. Those skilled in the art can select apertured filter types for use as apertured filter 13 that are particularly useful for filtering high spatial frequency components of the data page image such that the SNR of the HDS system is optimized. An exemplary result of spatial filtering using apertured filter 13 is shown in FIG. 4B. The resulting diffraction pattern is spatially filtered, thus "rounding" the square pixels and reducing pixel misregistration.

Referring again to FIG. 2, in one embodiment of the present invention, apertured filter 13 can be positioned at plane 16. Preferably, plane 16 coincides with a focal plane of first additional lens element 11. The position of apertured filter 13 as well as the size of its aperture 14 can be selected to pass only the spatial frequency components of the data page image that maximize the SNR of the selected hologram being read-out (see for example Bernal et al., Applied Optics, Vol 37, No. 23, pp 5377-5385 (1998) and G. W. Burr and M. P. Bernal Artajona, "System Optimization for Holographic Data Storage", Holographic Data Storage, H. J. Coufal, D. Psaltis, and G. T. Sincerbox (Eds.), Springer-Verlag, 2000 and references contained therein). For instance, an aperture size designed to sample the Nyquist sampling frequency, perhaps increased by all or some fraction of the Rayleigh criteria, achieves good SNR, whereas larger apertures can pass increased levels of noise and smaller apertures can pass decreased signal levels as well as cause interpixel crosstalk due to insufficient sampling of higher spatial frequencies of the Fourier spectrum of the data page hologram(s).

In one embodiment, the apparatus of the present invention can be used for readout of data page holograms which were recorded with the SLM operating in phase-modulating mode. Referring to FIG. 2, when SLM 1 operates to modulate the phase of the input light for signal beam 30, recording media 5 can be positioned at object (focal) plane 21 of imaging Fourier transform lens (second imaging lens element) 3. As a result, the size of the recording area at storage locations within photopolymerizable material 8 is reduced and areal density is increased. However, for a number of reasons it is desirable to convert a phase-modulated image into an amplitude modulated image for reading. Accordingly, in one embodiment, the NA, focal lengths and/or the size of aperture 14 of apertured filter 13 are selected so that apertured filter 13 operates as a phase contrast filter to convert a phase-modulated holographic image to an amplitude-modulated one.

Figure 6:
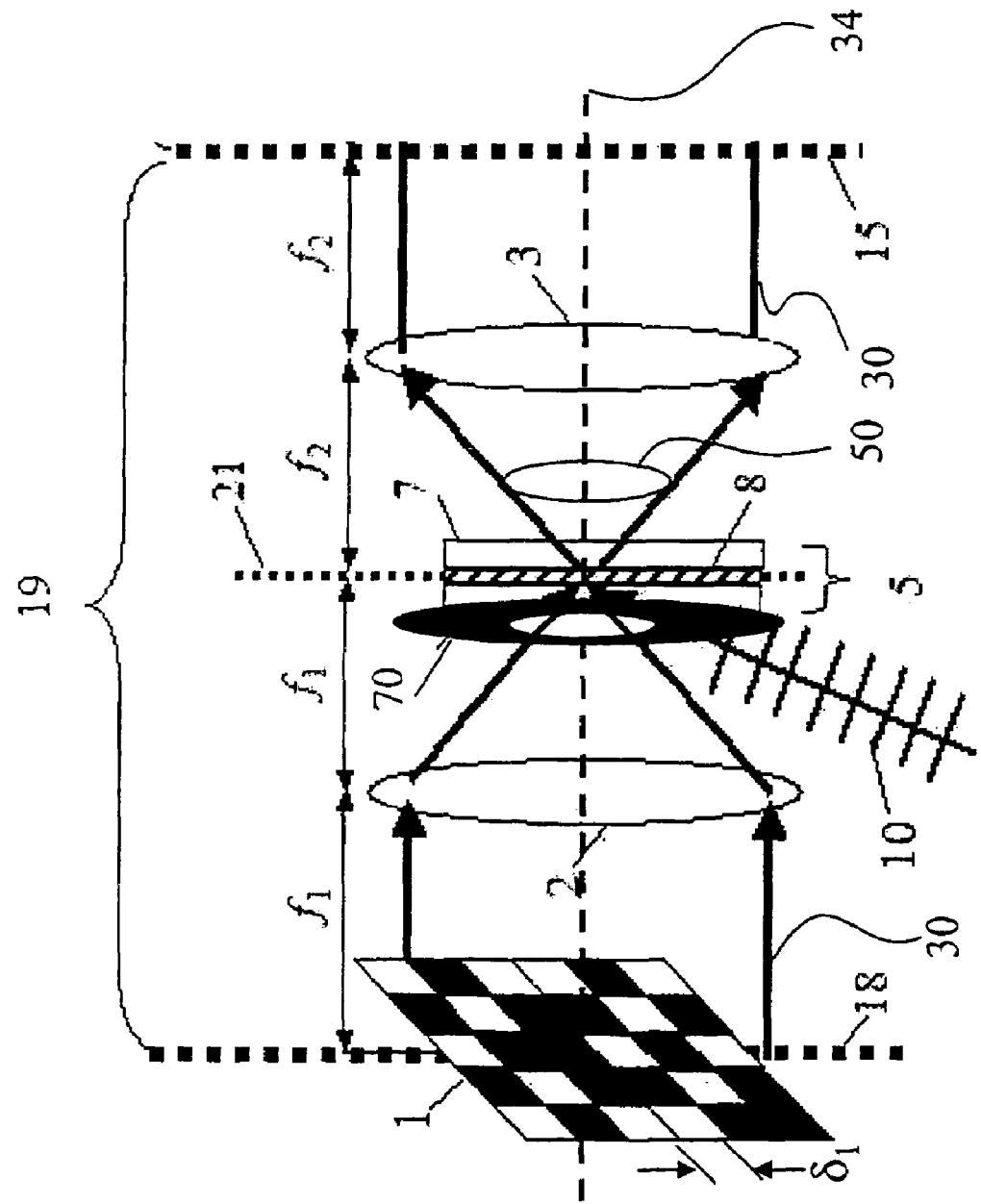
FIG. 6 is a schematic diagram illustrating one embodiment of an apparatus of the present invention for recording a holographic image.

In one embodiment, the present invention is a method of recording a holographic image. Referring to FIG. 6, the method comprises directing signal beam 30 through a holographic imaging system. The holographic imaging system includes an imaging lens elements 2 and holographic recording media 5, spaced apart along optical axis 34. The holographic imaging system further includes apertured filter 70, disposed between the imaging lens element and media 5 along optical axis 34 at or near the front surface of media 5 so as to filter higher order spatial frequencies of the Fourier transform of the object field and thereby prevent these from exposing the media in locations outside the selected storage location. The method further includes directing the filtered signal beam and reference beam 9 or 10 at a selected storage location on the holographic recording media 5, thereby recording a pattern of interference at the intersection of the filtered signal beam and the reference beam.

The present invention also relates to methods of recording and reading multiplexed holograms that reduces or substantially eliminates the need for variable adjustment of the incidence angle of the reference beam during reconstruction of the multiplexed holograms relative to corresponding angles used during recording.

A holographic recording media shrinks during recording. As a result, during reconstruction of holograms, the angle of incidence of the reference beam generally needs to be adjusted, i.e. made smaller or larger than the incidence angle of a reference beam used for recording of the hologram being reconstructed. Adjusting the incidence angle of the reference beam during reconstruction to an improved Bragg matching condition increases the SNR. The extent of shrinkage, however, varies from the first to subsequent holograms in a sequence of multiplexed holographic images. Variable adjustment of the incidence angle of the reference beam during reconstruction, relative to the corresponding angles used during recording, compensates for variable shrinkage of the holographic recording media. Variable adjustment, however, increases complexity of an HDS system, decreases fidelity of data recovery and is difficult to implement.

Accordingly, one embodiment of the present invention is a method of recording multiplexed holograms that substantially eliminates the need for variable adjustment during recording. In this embodiment, the present invention is a method of recording a plurality of holographic images in a holographic media. The method comprises (i) recording a first hologram of a plurality of multiplexed holograms in at least one storage location on the holographic recording media with a first interbeam angle and (ii) recording another of a plurality of multiplexed holograms in said storage location on the holographic recording media with a second interbeam angle, wherein the second interbeam angle is larger than the first interbeam angle. The multiplexed holograms at the storage location at issue are partially or fully overlapped. As used herein, the term "interbeam angle" is defined as the angle between the optical axis of the reference beam and the optical axis of the object beam.

In another embodiment, the present invention is a method of reading multiplexed holograms that substantially eliminates the need for variable adjustment. In this embodiment, the present invention is a method of reading a plurality of holographic images recorded in a holographic media. The method comprises (i) directing a reference beam at a storage location in a holographic recording media at a first incidence angle adjusted by a first adjustment angle, (ii) detecting and thereby reading a first of a plurality of multiplexed holograms in at the least one storage location, (iii) directing a reference beam at said storage location on the holographic recording media; wherein said storage location may be shifted from first storage location but is at least partially overlapped with said first storage location, at a second incidence angle adjusted by a second adjustment angle, (iv) detecting and thereby reading at least a second of the plurality of multiplexed holograms recorded in said at least one storage location, wherein the first and the second adjustment angles are substantially equal. A plurality of multiplexed holograms that are recorded in the manner described, wherein for a sequence of recordings a second interbeam angle is larger than the first interbeam angle, during read-out exhibit angle shifts from the optimum Bragg matching condition, relative to the corresponding angles of the reference beam used to record said multiplexed holograms, that are in the range of 0.1° for the first such multiplexed hologram diminishing to about 0.06° for the last multiplexed hologram that overlaps in the storage location. Consequently, for media with recording thickness in the range of about 0.5 mm, a global adjustment angle can be used during read-out for each reference beam angle wherein good SNR is achieved. When multiplexed holograms are instead recorded such that larger interbeam angles are first and smaller interbeam angles are last for a sequence of recordings, then the range of angle adjustments can exceed about 0.2° which is typically larger than the full-width-half-height of the Bragg detuning profile. In the latter case a global adjustment angle cannot be implemented without significantly diminishing SNR of the reconstructed holograms.

Accordingly, the present invention advantageously allows the variability in adjustment angles for overlapping or partially overlapping multiplexed holograms to be less than about 0.2°, preferably less than 0.1° and even more preferably less than 0.06° and more preferably less than 0.05°. In one embodiment, the variability in adjustment angle is about zero.

EXEMPLIFICATION

Using an apparatus and method of this invention, an areal density of about 75 to 100 bits/$\mu m^2$ has been recorded. The holographic recording media used was Aprilis HMC-050-G-15-C-300 Cationic Ring Opening Polymerization (CROP) media of 300 micron thickness. A 4f optical system of the type shown in FIG. 1 was used to record 75 and 100 co-locationally multiplexed data page holograms, respectively, with N=262 K bits/page. The numerical aperture (NA) of the 4f optical system was equal to 0.28 and the area of the storage location of the multiplexed holograms was 0.27 $mm^2$. Read-out of the co-locationally multiplexed data page holograms could not be accomplished with the 4f optical system of the type shown in FIG. 1 due to excessive noise contributions that substantially degraded the SNR of the reconstructed holograms to unacceptably low values (raw BER=$10^{-1}$). Read-out of the co-locationally multiplexed data page holograms, having diffraction efficiency of $\eta \leq 10E-4$, was, however, accomplished with acceptable SNR of $\geq 4.5$ ($10^{-3} \leq$ raw BER$\leq 6\times 10^{-3}$) without equalization for all of the data page holograms by using the method and apparatus of this invention, such as an embodiment shown in FIG. 2 wherein the NA of the additional optical system was about 0.125. Using an apparatus and method of this invention, an areal density of about 150 bits/$\mu m^2$ was recorded in Aprilis HMC-050-G-15-C-400 holographic recording media of 400 micron thickness. A 4f optical system of the type shown in FIG. 1 was used to record 155 co-locationally multiplexed data page holograms, respectively, with N=262 K bits/page. The numerical aperture (NA) of the 4f optical system was equal to 0.28 and the area of the storage location of the multiplexed holograms was 0.27 $mm^2$. Read-out of the co-locationally multiplexed data page holograms could not be accomplished with the 4f optical system of the type shown in FIG. 1 due to excessive noise contributions that substantially degraded the SNR of the reconstructed holograms to unacceptably low values (raw BER~$10^{-1}$). Read-out of the co-locationally multiplexed data page holograms, having diffraction efficiency in the range of $10E-4 \leq \eta \leq 10E-3$, was, however, accomplished with acceptable SNR of between 3.0 and 6.0 ($1E-4 \leq$ raw BER$\leq 6E-3$) without equalization for all of the data page holograms by using the method and apparatus of this invention, such as an embodiment shown in FIG. 2 comprising the additional optical system 20 with aperture filter 13, wherein the NA of the additional optical system was about 0.125.

While this invention has been particularly shown and described with references to preferred embodiments thereof, it will be understood by those skilled in the art that various changes in form and details may be made therein without departing from the scope of the invention encompassed by the appended claims.

What is claimed is:

1. An apparatus for recording or reading holographically stored information, comprising:
   a holographic imaging system for recording or reconstructing a hologram, said holographic imaging system having a first numerical aperture and a first focal length; and
   an additional optical system, having a second numerical aperture and a second focal length, said additional optical system configured to receive a reconstructed hologram from the holographic imaging system,
   wherein the numerical aperture of the additional optical system is less than the first numerical aperture of the holographic imaging system.

2. The apparatus of claim 1 wherein the additional optical system includes a first additional lens element and a second additional lens element, spaced apart.

3. The apparatus of claim 2 further including an apertured filter disposed between the first and the second additional lens elements.

4. The apparatus of claim 3 wherein the apertured filter is disposed at or near a focal plane of the first additional lens element.

5. The apparatus of claim 3 wherein the aperture of the apertured filter is adjustable in position or size or shape.

6. The apparatus of claim 2 wherein:
   the first additional lens element has the focal distance f3 and the second additional lens element has the focal distance f4, and wherein
   the holographic imaging system includes a first imaging lens element and a second imaging lens element wherein the first imaging lens element has the focal length f1 and the second imaging lens element has the focal length f2, spaced apart.

7. The apparatus of claim 6 wherein the first and the second additional lens elements are separated by a distance of f3+f4.

8. The apparatus of claim 7 wherein f3 is equal to f4.

9. The apparatus of claim 7 wherein f3 is not equal to f4.

10. The apparatus of claim 6 wherein the first and the second imaging lens elements are separated by a distance of f1+f2.

11. The apparatus of claim 10 wherein f1 is equal to f2.

12. The apparatus of claim 6 wherein the first and the second additional lens elements are separated by a distance that does not equal the sum of f3+f4.

13. The apparatus of claim 6 wherein the first and the second imaging lens elements are separated by a distance that does not equal the sum of f1+f2 along the optical path of the signal beam.

14. The apparatus of claim 6 wherein f2<f3.

15. The apparatus of claim 6 wherein the first and second lens elements of the holographic image system are substantially telecentric.

16. The apparatus of claim 6 wherein the first and second lens elements of the additional optical system are substantially telecentric.

17. The apparatus of claim 6, further including:
a spatial light modulator; and
a detector for detecting the reconstructed hologram, wherein the first and the second imaging lens elements are disposed between the spatial light modulator and the detector.

18. The apparatus of claim 17 wherein the additional optical system is disposed between the second imaging lens element and the detector.

19. The apparatus of claim 6 wherein the holographic imaging system further includes a holographic recording media disposed between the first and the second imaging lens elements.

20. The apparatus of claim 19 wherein the holographic recording media stores fully or partially overlapped multiplexed holograms in at least one storage location on the holographic recording media.

21. The apparatus of claim 20 wherein the first multiplexed hologram in a sequence recorded in a storage location is recorded with a smaller interbeam angle than holograms recorded later in the sequence.

22. The apparatus of claim 20 wherein holograms are recorded by angle-multiplexing or by combining at least two methods of multiplexing.

23. The apparatus of claim 20, wherein holograms are recorded by in-plane or out-of-plane shift multiplexing.

24. The apparatus of claim 19 wherein the holographic recording media is disposed at a focal plane of the first imaging lens element.

25. The apparatus of claim 19 wherein the holographic recording media is disposed between a focal plane of the first imaging lens element and the second imaging lens element.

26. The apparatus of claim 19 wherein the holographic recording media is disposed between a focal plane of the first imaging lens element and the first imaging lens element.

27. The apparatus of claim 19 further including an apertured filter disposed between the first and the second additional lens elements, and a second apertured filter disposed along the optical path of the reconstructed hologram or the optical path of a signal beam.

28. The apparatus of claim 27 wherein the second apertured filter is disposed between the first imaging lens element and the holographic recording media or between the holographic recording media and the second imaging lens element.

29. The apparatus of claim 2, further including:
a spatial light modulator; and
a detector for detecting the reconstructed hologram, wherein the first additional lens element and the second additional lens element are disposed between the spatial light modulator and the detector.

30. The apparatus of claim 29, wherein the holographic imaging system further includes a holographic recording media disposed between the spatial light modulator and the additional optical system.

31. The apparatus of claim 2 wherein:
the first additional lens element has the focal distance f3 and the second additional lens element has the focal distance f4, and wherein
the holographic imaging system includes a first imaging lens element having focal length f1.

32. The apparatus of claim 31 wherein the first and the second additional lens elements are separated by a distance of f3+f4.

33. The apparatus of claim 31 wherein the first and the second additional lens elements are separated by a distance that does not equal the sum of f3+f4.

34. The apparatus of claim 31 wherein f3 is equal to f4.

35. The apparatus of claim 31 wherein f3 is not equal to f4.

36. The apparatus of claim 31 wherein the first and second lens elements of the additional optical system are substantially telecentric.

37. The apparatus of claim 31 wherein the holographic imaging system further includes:
a holographic recording media;
a spatial light modulator; and
a detector for detecting the reconstructed hologram, wherein the first imaging lens element is disposed between the spatial light modulator and the recording media.

38. The apparatus of claim 37, wherein the additional optical system is disposed between the first imaging lens element and the detector.

39. The apparatus of claim 37, wherein the holographic recording media stores fully or partially overlapped multiplexed holograms in at least one storage location on the holographic recording media.

40. The apparatus of claim 37, wherein the holographic recording media is disposed at a focal plane of the first imaging lens element.

41. The apparatus of claim 37, wherein the holographic recording media is disposed between a focal plane of the first imaging lens element and the first imaging lens element.

42. The apparatus of claim 37, further including an apertured filter disposed along the optical path of the reconstructed hologram or along the optical path of a signal beam.

43. The apparatus of claim 1 wherein the additional optical system magnifies or demagnifies the reconstructed hologram.

44. The apparatus of claim 1 wherein the additional optical system further includes at least one element selected from polarizers, waveplates, mirrors, or patterned amplitude filter.

45. The apparatus of claim 1 wherein focal length of the holographic imaging system is less than the focal length of the additional optical system.

46. A method of reading a holographically recorded image, comprising:
directing a reference beam into a holographic imaging system that includes a holographic recording media, said reference beam directed onto the holographic media at a storage location, and said holographic imaging system having a first numerical aperture and a first focal length, thereby reconstructing a hologram;
directing or relaying the reconstructed hologram through an additional optical system, having a second numerical aperture and a second focal length, wherein the second numerical aperture is smaller than the first numerical aperture; and detecting the reconstructed signal hologram.

47. The method of claim 46 wherein the holographic recording media stores fully or partially overlapping multiplexed holograms in at least one storage location on the holographic recording media.

48. The method of claim 46 wherein the additional optical system further includes a first additional lens element and a second additional lens element, spaced apart.

49. The method of claim 48 wherein the lens elements of the additional optical system are substantially telecentric.

50. The method of claim 48 wherein the additional optical system is configured so that the second focal length is greater than the first focal length.

51. The method of claim 50 wherein the additional optical system further includes an apertured filter having an aperture, said apertured filter disposed between the first and the second additional lens elements.

52. The method of claim 51 wherein the apertured filter is disposed at or near a focal plane of the first additional lens element.

53. The method of claim 51 wherein the aperture of the apertured filter of the additional optical system is adjustable in position or size or shape.

54. The method of claim 53 wherein the size and the shape of the aperture in the apertured filter are selected to substantially filter out scattered light or stray light or undiffracted reference beam.

55. The method of claim 51 wherein the size and the shape of the aperture in the apertured filter of the additional optical system is adjusted to select spatial frequencies.

56. The method of claim 46 wherein the holographic imaging system further includes a first imaging lens element having focal length f1, and a second imaging lens element, having focal length f2, spaced apart.

57. The method of claim 56 wherein the first and the second imaging lens elements are substantially telecentric.

58. The method of claim 56, wherein
the additional optical system includes a first additional lens element, having focal length f3 and a second additional lens element, having focal length f4, spaced apart.

59. The method of claim 58 wherein f3>f2.

60. The method of claim 59 wherein f3=f4.

61. The method of claim 59 wherein f3≠f4.

62. The method of claim 59 wherein the reconstructed hologram is phase-modulated and further wherein the size and the aperture of the apertured filter is selected to convert phase modulation into an amplitude modulation.

63. The method of claim 58 wherein f3 and f4 are selected to magnify or demagnify an image carried by the reconstructed hologram.

64. The method of claim 46 wherein the numerical aperture or the focal length of the additional optical system are selected to substantially filter scattered light, stray light or undiffracted reference beam.

65. The method of claim 46 wherein the numerical aperture or the focal length of the additional optical system are selected to filter forward scattered light in the range of at least about 0° to ±5° from the propagation direction of the undiffracted reference beam.

66. The method of claim 46, wherein the holographic imaging system further includes a first imaging lens element having focal length f1.

67. An apparatus for reading a holographically recorded image, comprising:
means for directing a reference beam into a holographic imaging system and reconstructing a signal beam, said holographic imaging system including a holographic recording media, said reference beam directed onto the holographic media, and having a first numerical aperture and a first focal length;
means for directing the reconstructed signal beam through an additional optical system and filtering the reconstructed signal beam, said additional optical system having a second numerical aperture and a second focal length, wherein the second numerical aperture is smaller than the first numerical aperture; and
means for detecting the filtered reconstructed signal beam.

68. The apparatus of claim 67 wherein the holographic recording media stores fully or partially overlapping multiplexed holograms in at least one storage location on the holographic recording media.

69. An apparatus for recording or reading holographically stored information, comprising:
a holographic imaging system for recording or reconstructing a hologram, said holographic imaging system having a first numerical aperture;
a holographic recording media optically coupled to the holographic imaging system;
a detector, optically coupled to the holographic recording media; and
an additional optical system, having a second numerical aperture, wherein the first numerical aperture is greater than the second numerical aperture, and further wherein the additional optical system is disposed between the holographic recording media and the detector.

* * * * *